United States Patent [19]

Lebailly

[11] 4,013,918
[45] Mar. 22, 1977

[54] ELECTROLUMINESCENT DIODE HAVING THRESHOLD EFFECT

[75] Inventor: Jacques Lebailly, Caen, France

[73] Assignee: U.S. Philips Corporation, New York, N.Y.

[22] Filed: July 2, 1974

[21] Appl. No.: 485,225

[30] Foreign Application Priority Data

July 3, 1973  France ............................. 73.24412

[52] U.S. Cl. ............................. 315/71; 313/500; 357/17; 357/51
[51] Int. Cl.² .................. H01L 27/15; H01L 33/00; H05B 33/14
[58] Field of Search .............. 315/71; 313/499, 500; 357/17, 51

[56] References Cited

UNITED STATES PATENTS

| | | | |
|---|---|---|---|
| 3,289,093 | 11/1966 | Wanlass | 357/51 X |
| 3,404,304 | 10/1968 | Bonin et al. | 313/499 |
| 3,614,480 | 10/1971 | Berglund et al. | 357/51 X |
| 3,754,171 | 8/1973 | Anzai et al. | 357/51 X |
| 3,806,777 | 4/1974 | Edmonds | 357/17 |

Primary Examiner—Palmer C. Demeo
Attorney, Agent, or Firm—Frank R. Trifari; Leon Nigohosian

[57] ABSTRACT

A monolithic electroluminescent semiconductor device comprising a monocrystalline semiconductor body having a major surface; a semiconductor zone which extends along a part of said major surface of said semiconductor body, said zone adjoining a portion of the semiconductor body and forming therewith a diode that can emit radiation, said diode having a junction which extends to at least said surface of said semiconductor body; a current path element disposed at said major surface and connected electrically in parallel with said junction, said current path element being physically separate from said semiconductor zone and said semiconductor body portion and leaving said junction at least partly intact at said surface, whereby the current voltage characteristics of said current path and of said diode intersect each other and the dynamic admittance of said current path at the intersection is smaller than that of said diode.

16 Claims, 14 Drawing Figures

ELECTROLUMINESCENT DIODE HAVING THRESHOLD EFFECT

The invention relates to a monolithic electroluminescent semiconductor device comprising a monocrystalline semiconductor body having a zone which extends along a part of a major surface of the semiconductor body, which zone forms a diode with adjoining material of the semiconductor body, which diode can emit radiation and has a junction which extends to at least the surface of the semiconductor body.

It is to be noted that the terms used hereinafter such as light power, light flux, luminous efficiency, luminescence, sensitive radiation apply to any radiation which is emitted by an electroluminescent emitter in the energy range used which corresponds to the sensitivity range of the receiver. The terms apply to the visible spectrum, for example, in the case of an electroluminescent display device, but also to the infrared, for example, in the case of a photocoupling device having receivers which are sensitive to infrared.

It is known that the light flux which is emitted by an electroluminescent diode varies with the strength of the current which passes through it. Although with comparatively small strength the luminous efficiency of the diodes is weaker than with the strength corresponding to normal operation, the emission emitted by a weak current is not always zero, nor negligible. Especially in logic devices the luminescence which is caused by residual currents, by insulation defects, by leakage of a supply circuit may be very annoying. The diode mosaics, especially the matrices of the XY-type, often show stray currents which may also give rise to untimely luminescence action.

The invention endeavours to reduce the luminescence of a diode having a semiconductor junction when same is traversed by currents of a small value.

One of the objects of the invention is to provide a monolithic electroluminescent device having threshold effect which does not emit radiation below a given strength threshold of the supply current.

Another object of the invention is to provide an electroluminescent monolithic device having threshold effect which emits a radiation the level of which is at least equal to a given value which corresponds to a given strength threshold of the supply current.

The characteristic curve of the current as a function of the voltage $I = f(V)$ of an electroluminescent diode having a junction has a known shape in the case of supply voltages in the forward direction and linear coordinates. With voltages which are lower than an initial voltage which lies near the voltage which corresponds to the minimum energy of the recombination junctions of the charge carriers, the impedance of the diode is very high; with supply voltages with increasing values above the said initial voltage, the impedance of the diode rapidly decreases and the slope of the curve, which corresponds to the dynamic admittance of the diode (which is a function of the series resistance of the two regions of the diode) becomes very steep.

According to the invention, the monolithic electroluminescent semiconductor device comprises monocrystalline semiconductor body having a zone which extends along a part of a major surface of the semiconductor body, which zone forms a diode with adjoining material of the semiconductor body, which diode can emit radiation and comprises a junction which extends to at least the surface of the semiconductor body is characterized in that a current path which is connected electrically in parallel with the junction and leaves said junction at least partly in tact is present at the major surface, while the current voltage characteristics of the current path and of the diode intersect each other and the dynamic admittance of the current path at the intersection is smaller than that of the diode.

The characteristic of the current path is determined as a function of the possible stray currents which are caused by the supply or by the device itself.

Because the dynamic admittance of the current path in the intersection is smaller than the dynamic admittance of the diode, the value of the current through the current path decreases relative to the current in the diode when the value of the overall current increases. With supply currents of small value, in particular such as the stray currents caused by poor isolation, a large part of the overall current passes along the current path. With supply currents of high value a small part of the overall current passes along the said current path and the overall efficiency of the device is not adversely influenced.

The current path connected in parallel with the electroluminescent diode in a device according to the invention may consist of elements of different nature. According to a first embodiment the said path consists of a resistor the characteristic $I = f(V)$ of which is a straight line which passes through the point $I = 0$, $V + 0$. The value of this resistor is higher than the value of the series resistor of the two regions of the electroluminescent diode.

According to another embodiment the current path comprises a diode which is biased in the forward direction and which will hereinafter be referred to as parallel diode. The said parallel diode has a junction the initial voltage of which, which corresponds to the potential barrier of the said junction, is lower than that of the electroluminescent diode. Moreover, the total of the series resistors of the regions and the contact and connection means of the said parallel diode is higher than the overall resistances of the regions and the contact connection means of the electroluminescent diode.

According to another embodiment the said current path comprises a diode which is biased in the direction opposite to that of the electroluminescent diode, the latter being biased in the forward or direct direction and the so-called parallel diode in the reverse direction. Said parallel diode has an inverse breakdown voltage which lies beyond the supply voltage limits of the device and dynamic admittance in the reverse direction of the said parallel diode is higher than the dynamic admittance of the electroluminescent diode in the forward direction at absolute values of the supply voltage which are lower than the initial voltage of the latter.

The parallel diode biased in the reverse direction shows a curve $I = f(V)$ which has the advantage, as compared with that of a resistor, of having a convex part in the zone of the voltages which are lower than the inverse breakdown voltage. The effect of the parallel arrangement of said diodes resembles that of the parallel arrangement of a truly ohmic resistor and is even more favourable.

The parallel diode connected in parallel with the electroluminescent diode may be of the Schottky type which comprises a semiconductor region which contacts a metal element in which the said contact has rectifying properties and an initial voltage in the order of ⅔ of the initial voltage of a p-n junction in the same material.

The parallel diode arranged in parallel with the electroluminescent diode may be a diode having a p-n junction between one of the regions of the electroluminescent diode and a region which consists of a semiconductor material having a smaller forbidden bandwidth than the material of the said electroluminescent diode, the p-n junction being a hetero junction the initial voltage of which in the forward direction is smaller than that of the electroluminescent diode.

According to another embodiment the said current path comprises a resistance part and a part which forms diodes and which is biased either in the forward direction or in the reverse direction.

According to a variation of the various embodiments, the electroluminescent diode and the current path are parallel with a diode for protecting the electroluminescent diode against overload and excess voltage as is provided as is provided in the device which forms part of a French patent application filed simultaneously with the present application in the name of the Applicants and entitled:" Protected electroluminescent diode". The safety diode is integrated in the same manner in the device as the path. The safety diode passes substantially no current in the region of the energisation level which proceeds from zero to above the initial voltage of the electroluminescent diode. Said parallel diode thus does not disturb the operation of the assembly consisting of the electroluminescent diode and the current path.

From the various embodiments follow various structures which also depend upon the shape of the electroluminescent diode, which shape is determined by the considered use and technique of the selected materials.

The current path arranged parallel to the electroluminescent diode preferably has a planar structure and is present at the surface of the device. The current path preferably comprises at the surface of the device a local layer of a material having a given resistivity in electric contact with each of the regions of the electroluminescent diode.

In an embodiment of the device of the electroluminescent diode is a diode having a planar structure and the local layer consists of a deposit of a material, polycrystalline or vitreous, of a low resistivity the contact of which with both regions of the diode is purely ohmic. The current path which is parallel to the diode is reduced to a resistance of low value. The known techniques of depositing thin layers permit of an extensive choice of materials and thicknesses. On a diode manufactured from a semiconductor material of the so-called III-V type, the layer may be manufactured, for example, from tin oxide or indium oxide.

In another embodiment of the device the local layer consists of a deposit of a semiconductor material having a low resistivity and of which the contact with one of the two regions of the electroluminescent diode is purely ohmic and the contact of which with the other region forms a diode with hetero junction having rectifying properties in the same sense as the electroluminescent diode, the characteristic $I = f(V)$ of said parallel diode with hetero junction showing a smaller initial voltage than that of the electroluminescent diode. The combination of the hetero junction and the deposited layer shows a characteristic $I = f(V)$ which may satisfy the above denoted requirements for the current path. On a diode manufactured from a semiconductor material compound of the III-V type the layer is manufactured, for example, by a deposit of a III-V compound of different nature, such as GaAs, GaP, GaAsP, GaAsAl of the p-conductivity type on a region of n–type.

In another embodiment of the device the localized layer consists of a deposit of a possibly polycrystalline semiconductor material of a low resistivity the contact of which with one of the regions of the electroluminescent diode is purely ohmic and the contact of which with the other region which is manufactured by means of an intermediate metal element, forms a diode of the Schottky type having rectifying properties in the same sense as the electroluminescent diode, the characteristic current voltage $I = f(V)$ of said parallel diode showing a smaller initial voltage than that of the electroluminescent diode, The combination of the deposited layer and of the Schottky contact shows a characteristic $I = f(V)$ which may satisfy the above-denoted requirements for the current path. On a diode manufactured from a semiconductor material of the III-V type, the layer is manufactured, for example, depositing a III-V compound of the same nature or a different nature, such as GaAs, InAs, GaP, GaAsP, GaAlAs, InGaAs or of a II-VI compound, such ZnTe, CdS, CdTe, CdSe or of an element such as Si or Ge.

In a variation of this embodiment of the device the local layer forming the path consists of a deposit of a metallic material having a low resistivity the contact of which with one of the regions of the electroluminescent diode is purely ohmic and the contact of which with the other region forms a junction of the Schottky type with rectifying properties in the same sense as the electroluminescent diode, the characteristic $I = f(V)$ of said parallel diode showing a smaller initial voltage than that of the electroluminescent diode. In this case the series resistance of the parallel diode is also obtained by the choice of dimensions and the geometry of the Schottky layer and Schottky contact.

In another embodiment in which the electroluminescent diode is of the planar type having a first region obtained by diffusion in a substrate which forms the second region, the local surface layer which forms the current path is a locally diffused layer of a small depth of the same conductivity type as the first diffused region but having a considerably higher concentration of impurities, in which the said layer is in contact with the said first region. The contact zone between the first region and the diffused layer is preferably restricted to a small part of the circumference of the first region so that the surface zone of the junction between the two regions is maintained, of which surface zone the luminous efficiency is substantially zero with a low energisation current level and which on the contrary is endeavoured to nullify in the known devices, for example, the diode having a so-called guard ring. The diffused layer is in contact with the contact means of the two regions of the electroluminescent diode and is thus parallel to the whole of the junction. The diffused layer is localised according to dimensions which are suitable for the required resistance value.

In another embodiment in which the electroluminescent diode is of the planar type having a first region diffused in a substrate of the opposite conductivity type which forms the second region, the local surface layer which forms the current path is a locally diffused layer of a small depth of the same conductivity type as the substrate but having a higher concentration of impurities, in which the said layer is in contact with the first region over at least a part of the circumference of said layer. The diffused layer forms a surface junction with the first layer parallel to the junction of the electroluminescent diode, but the leakage current of said surface junction is higher at voltages which are lower than the initial voltage due to the high concentration of impurities, while the dynamic admittance thereof is low with a high current strength due to the geometry thereof and due to a sufficient distance between the said layer and the contact means on each of the two regions of the electroluminescent diode.

In another embodiment the current path is a parallel diode which is formed by the junction between a first surface zone and adjoining one of the regions of the electroluminescent diode and having a conductivity type opposite to that of the region and a second zone adjoining the first and the conductivity of which is opposite to that of the first zone and which is connected to the other region of the electroluminescent diode by connection means with purely ohmic contact. The second zone is obtained by alloying, metallisation, diffusion or epitaxy.

In this embodiment, when the device comprises an electroluminescent diode having a planar structure which contains a first local diffused surface region in a substrate which forms the second region, the current path preferably consists of a first surface layer which is locally diffused in the said substrate but has the same conductivity type as the first region and without contact with the latter, a second surface layer being diffused locally in the second layer having a conductivity type opposite to that of the first layer. The contact means are provided on the various diffused regions and layers in such manner that the two formed diodes are biased in parallel, one in the forward direction and the other in the reverse direction. The doping of the first surface layer is sufficiently high to enable a comparatively strong current in the reverse direction through the parallel diode, which current varies only slightly with the applied voltage in a considerable voltage range.

The manufacture of the device according to the invention in the various above stated forms comprises only variations of the known technique which are usually used in semiconductor manufacture.

The invention may be applied to any electroluminescent diode which is destined for digital devices, a display device, a photocoupling device or the like. The invention may be used in particular in mosaics of electroluminescent diodes having planar structure, which mosaics are, for example, combinations of separated diodes which are connected on a single support or combinations of diffused diodes in a single crystal. It is favourable to use the invention in combinations of diodes arranged according to an XY matrix, in which each diode is supplied with on the one hand the corresponding column, on the other hand the corresponding row, which arrangement may give rise to stray surface currents.

The invention may also be used advantageously in photocoupling devices which comprise a photoemitter and photoreceiver which are electrically insulated from each other and in which the characteristic features of the photoreceiver determine the values of the light power of the photoemitter element the supply of which on the other hand meets certain requirements.

The invention will be described in greater detail with reference to the accompanying drawings.

FIG. 1 of the drawings accompanying the present application shows in linear coordinates the curves $I = f(V)$ of currents as a function of the applied voltage in a device according to the invention. The curve D is the curve $I = f(V)$ of the electroluminescent diode having p-n junction of the device; it shows a sharp bend at a voltage $V_c$, hereinafter termed initial voltage, the value of which corresponds to the potential barrier of the junction of the diode. The curve F is the curve $I = f(V)$ of the current path which is arranged parallel to the electroluminescent diode in the device. This path consists of an element having a dynamic admittance which is lower than that of the electroluminescent diode in the intersection of the curve D and F. Curve G relates to the assembly of the device of the diode and the path.

FIG. 2 of the drawings accompanying the present application relates to said first embodiment and shows: at D the curve $I = f(V)$ of the electroluminescent diode, at R the characteristic straight line of the resistor parallel to said diode and at M the curve $I = f(V)$ of the device which is formed by the diode and the parallel resistor.

FIG. 3 of the drawings accompanying the present application relates to said second embodiment and shows: at D the curve $I = f(V)$ of an electroluminescent diode, at P the curve $I = f(V)$ of the parallel diode with an initial voltage $V_p$ which is lower than $V_c$, and at N the curve $I = f(v)$ of the device formed by the two parallel diodes.

FIG. 4 of the drawings accompanying the present application relates to said third embodiment and shows at D the curve $I = f(V)$ of an electroluminescent diode, at H the curve $I = f(V)$ of the parallel diode biased in the reverse direction and at J the curve $I = f(V)$ of the device which is formed by the two parallel diodes.

In order to illustrate the various embodiments of the device according to the invention, a diffused planar electroluminescent diode has usually been chosen by way of example, which diode is formed in a plate of III-V semiconductor material.

Figure 1:
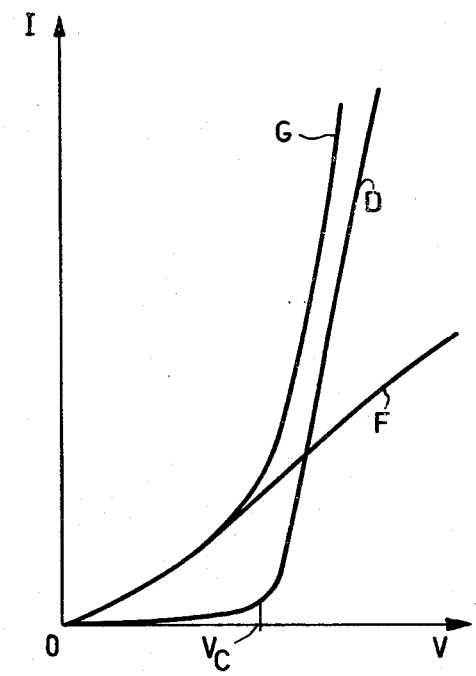
Figure 2:
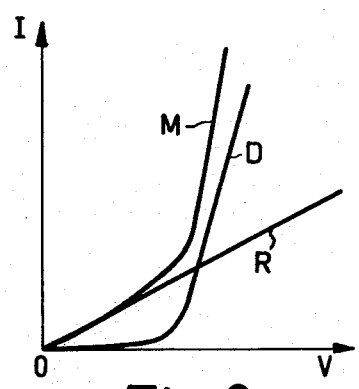
Figure 3:
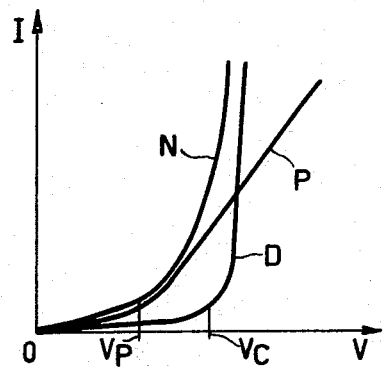
Figure 4:
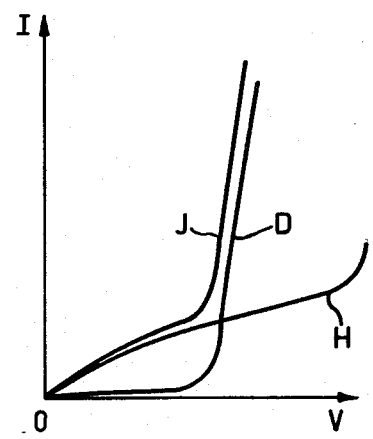
Figure 5:
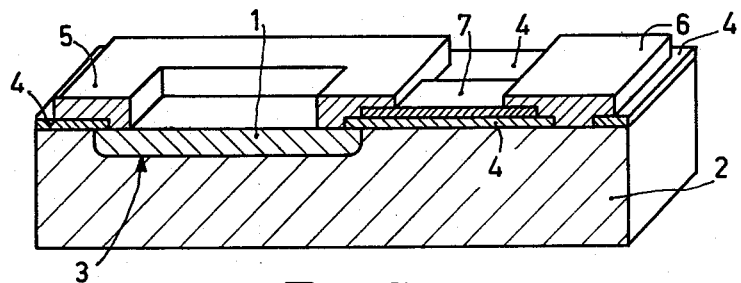
FIG. 5 is a diagrammatic perspective cross-sectional view of an embodiment of the invention.

The device shown in FIG. 5 comprises an electroluminescent diode which is formed by a region 1 diffused in a substrate 2 of the opposite conductivity type having the junction 3. The surface of the crystal is protected by an insulating and passivating layer 4 with the exception of the two surfaces which are reserved for contacts with the two regions 1 and 2 of the diode whose contact means consist of metal deposits 5 (on the region 1) and at 6 (on the substrate 2). On the insulating layer 4 a layer 7 is locally deposited of a given resistivity and the surface of which is restricted to a narrow strip which is in contact with the metal deposits 5 and 6. Said strip 7 forms the path which is arranged in parallel with the electroluminescent diode. The strip 7 is insulated from the diode by the passivating layer 4.

Figure 6:
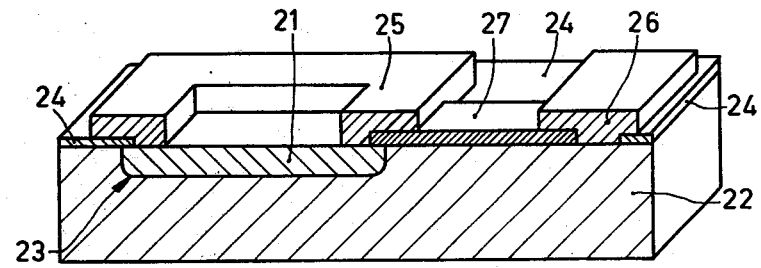
FIG. 6 is a diagrammatic perspective cross-sectional view of another embodiment of the invention.

The device shown in FIG. 6 comprises an electroluminescent diode formed by diffusion of a region 21 in a substrate 22 which forms the second region of the opposite conductivity type with the junction 23. The surface of the crystal is protected by an insulating and passivating layer 24. Metal deposits 25 and 26 form the contact means of the regions 21 and 22, respectively. Between the metal deposits 25 and 26, in a window of the layer 24, a layer 27 which is manufactured from a material having a given resistivity and the surface of which is restricted to said window is deposited on the surface of the substrate 22 in contact with on the one hand the contact 25 and on the other hand the contact 26. Said layer 27 which is in the form of a strip forms the path which is parallel to the electroluminescent diode. The strip 27 locally short-circuits the junction 23 and is not insulated from the two regions of the diode.

Figure 7:
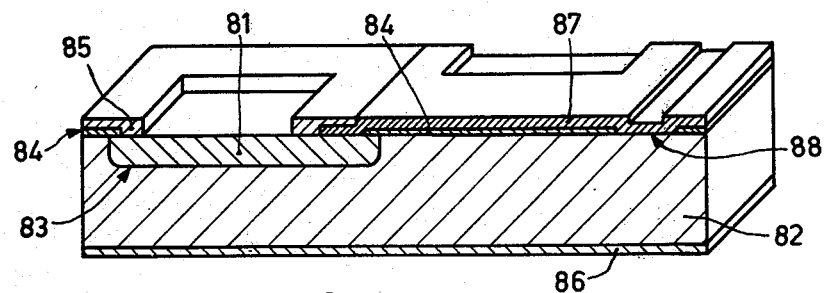
FIG. 7 is a diagrammatic perspective cross-sectional view of a third embodiment of the invention.

The device shown in FIG. 7 comprises an electroluminescent diode formed by diffusion from a region 81 of the p-conductivity type in a substrate 82 which forms a second region of the n-conductivity type, with the junction 83. The surface of the crystal is protected by an insulating and passivating layer 84. Metal deposits 85 and 86 form the contact means of the regions 81 and 82, respectively. A layer 87 of a semiconductor material of the same conductivity type as the region 81 and of a smaller forbidden bandwidth than the material of regions 81 and 82 is in contact with each of the two regions. The layer 87 forms with the region 82 a hetero junction 88 of the characteristics of which shows a lower initial voltage than that of the junction 83 of the electroluminescent diode. The layer 87 and the hetero junction 88 form the current path which is parallel to the electroluminescent diode.

Figure 8:
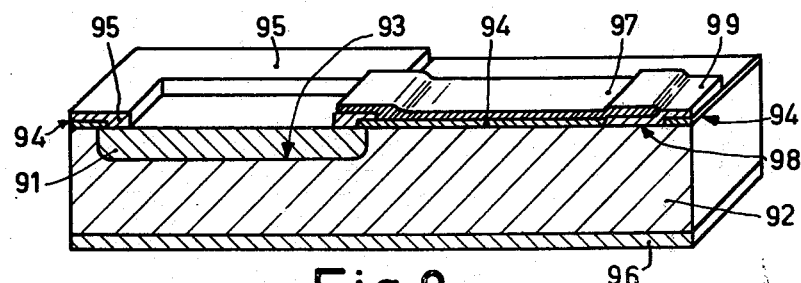
FIG. 8 is a diagrammatic perspective cross-sectional view of a fourth embodiment of the invention.

The device shown in FIG. 8 comprises an electroluminescent diode formed by diffusion of a region 91 of the p-conductivity type in a substrate 92 which forms a second region of the n-conductivity type with the junction 93. The surface of the crystal is protected by an insulating and passivating layer 94. Metal deposits 95 and 96 form the contact means of the regions 91 and 92. A deposited layer 99 of a metallic material forms a junction 98 of the Schottky type by contract with the region 92. A layer 97 of a material, for example, a semiconductor of the same nature as the material of the electroluminescent diode and the same conductivity type as the region 91, is in ohmic contact with on the one hand the deposit 95 and the other hand the deposit 99. The layer 97 and the Schottky diode 98 form the current path which is parallel to the electroluminescent diode.

Figure 9:
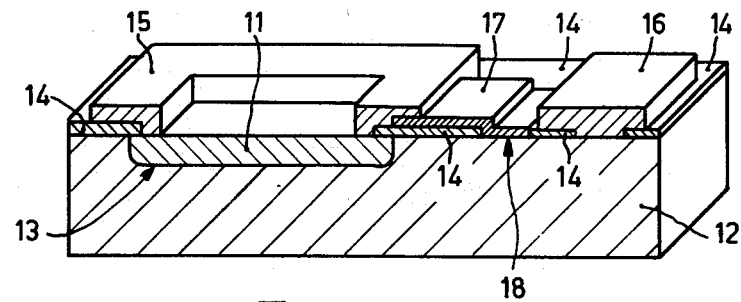
FIG. 9 is a diagrammatic perspective cross-sectional view of a fifth embodiment of the invention.

The device shown in FIG. 9 comprises an electroluminescent diode formed by diffusion of a region 11 in a substrate 12 of the opposite conductivity type with the junction 13. The surface of the crystal is protected by an insulating and passivating layer 14. Metal deposits 15 and 16 form the contact means of the region 11 and of the substrate 12. On the insulating layer 14 a layer 17 is locally deposited the surface of which is restricted by a narrow contact strip on the one hand with the metal deposit 15 but on the other hand at 18 with the surface of the substrate which serves as a second region; this contact 18 between the strip 17 and the substrate 12 forms a Schottky diode. The strip 17 and the Schottky diode 18 which thus are in series from the current path which is parallel to the electroluminescent diode.

Figure 10:
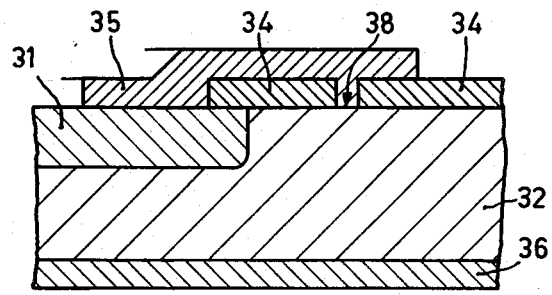
FIG. 10 is a partial diagrammatic cross-sectional view of a sixth embodiment of the invention.

In the partial cross-sectional view of FIG. 10 is shown a variation of the preceding embodiment. According to this variation a deposit 35 which serves as a contact means on the first region 31 of the diode is in contact in one or several nearly punctiform contact places 38 with the second region 32 formed by the substrate, said contacts passing through the insulating and passivating layer 34.

The resistance of the deposited layer 35 which is combined with the resistance of the contacts 38 which also form small Schottky diodes, forms the current path which is parallel to the electroluminescent diode. The contact on the second region 32 consists of a conductive layer 36.

Figure 11:
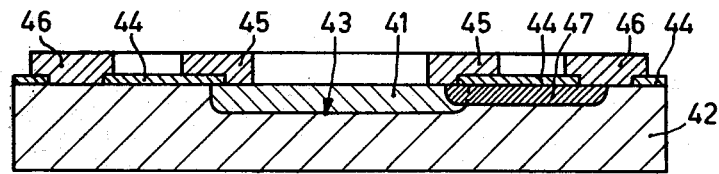
FIG. 11 is a diagrammatic cross-sectional view of a seventh embodiment of the invention.

The device shown in FIG. 11 comprises an electroluminescent diode formed from a first region 41 and a second region 42 of the opposite conductivity type which determine a junction 43. The surface of the crystal is protected by an insulating and passivating layer 44. Metal deposits 45 and 46 form the contact means of the regions 41 and 42 respectively. The device has a circular shape, the deposits 45 and 46 and the various parts of the layer 44 are annular. A layer 47 which locally is diffused to a smaller depth with a strong concentration of doping means continues the region 41 below the layer 44 up to the ring 46. The layer 47 has a resistance which locally short-circuits the junction 43 and forms the current path which is parallel to the electroluminescent diode.

Figure 12:
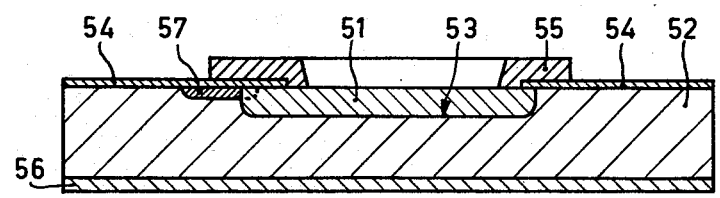
FIG. 12 is a diagrammatic cross-sectional view of an eighth embodiment of the invention.

The diffused layer 47 is of the same conductivity type as the region 41. On the contrary, in the device shown in FIG. 12 a locally diffused layer is used to form the current path which is parallel to said diode and said layer is of the same conductivity type as the substrate. Said device comprises an electroluminescent diode which is formed from a first region 51 and a second 52 of the opposite conductivity type which consists of the substrate plate; the two regions determine a junction 53. The surface of the crystal is protected by an insulating and passivating layer 54. Metal deposits 55 and 56 serve for the contact with the region 51 and the plate 52, respectively. The device has, for example, a circular shape and the deposits 55, as well as the layer 54, are annular. A surface layer 57 which locally has been diffused to a smaller depth and which has a very strong concentration of doping means which give the same conductivity type as the second region 52 adjoins the region 51 and forms with it a locallized junction which is parallel to the junction 53; said localized junction which gives a part of the current of the device a fixed direction forms a current path which is parallel to the electroluminescent diode.

Figure 13:
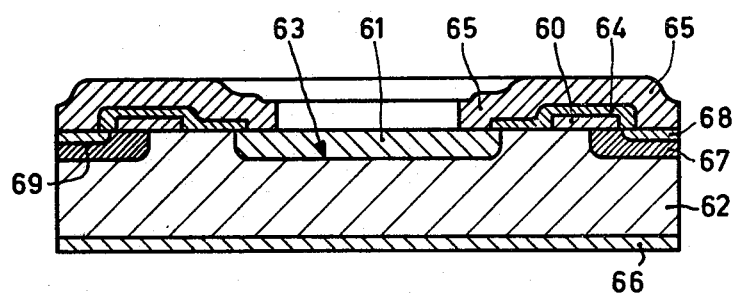
FIG. 13 is a diagrammatic cross-sectional view of a ninth embodiment of the invention.

The device shown in FIG. 13 also comprises an electroluminescent diode which is formed from a first region 61 which is diffused in a plate which forms a second region 62 of the opposite conductivity type; the two regions determine a junction 63. The surface of the plate is protected by an insulating and passivating layer 64. Metal deposits 65 and 66 serve to contact the first 61 and the second region 62, respectively, which deposited are, for example, circular. An annular layer 67 of the same conductivity type as the region 61 and with a very high concentration of impurities is diffused in the plate 62 and an annular region 68 having the same conductivity type as the plate but with a very high concentration of impurities is diffused in the annular layer 67 and thus forms an annular junction 69. The metal deposit 65 is in contact with the region 68 and another annular metal deposit 60 connects the region 67 electrically to the region 62. The diode 67, 68 which is associated with the electroluminescent diode and which is biased in the reverse direction when the latter is biased in the forward direction forms the current path which is parallel to the electroluminescent diode. The concentrations of impurities in the layers 67 and 68 are determined so that the inverse breakdown voltage of the junction 69 is higher than the maximum supply voltage of the device and the dynamic admittance of the current path between the contact means 65 and 60 is higher than that of the electroluminescent diode at values of the supply voltage which are lower than the initial voltage of the latter.

Figure 14:
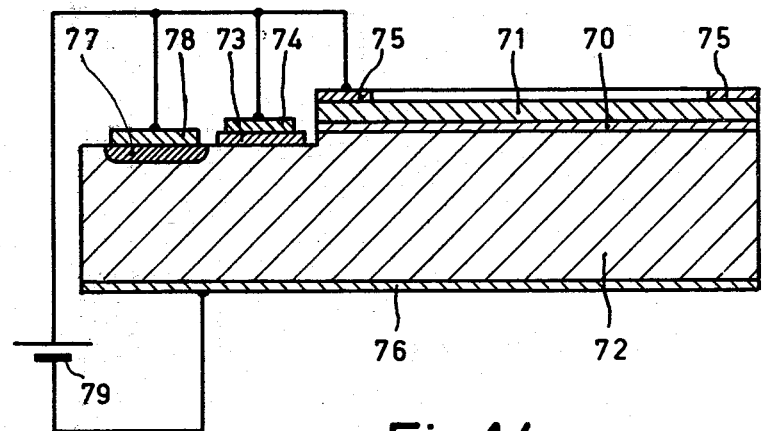
FIG. 14 is a diagrammatic cross-sectional view of a tenth embodiment of the invention.

The device shown in FIG. 14 comprises an electroluminescent diode which is formed from a first region 71 which is deposited by epitaxy on a layer 70 which forms a second layer which itself is deposited by epitaxy on a plate 72. In this case the plate is, for example, a strongly doped $n^+$ conductivity type, the layer 70 of the n-type and the region 71 of the of the p-type. In a part of the surface of the plate 72 a region 77 of the p-type is diffused. In another part of the surface of the plate 72 a layer 73 is deposited of a material which forms a junction of the Schottky type with the material of the plate 72.

At 78, contact means are provided on the diffused region 77, at 74 on the layer 73, at 75 on the region 71 and at 76 on the plate 72. The three diodes of the device are supplied in parallel by means of a source 79. The initial voltage of the Schottky junction 73/72 is a part of the initial voltage of the junction 71/70 and the initial voltage of the junction 77/72 is higher than the initial voltage of the junction 71/70, which is obtained, for example, by using for the electroluminescent diode 71/70 a strongly compensated material. With this device an electroluminescent diode with threshold effect is available which is protected from overload or excess voltage. The nature of the materials which serve for the manufacture of the current path added according to the invention and the dimensions of said current path are determined as a function of the material of the electroluminescent diode, of the possible requirements as to its place and of the optical and electrical characteristics of said diode. For example, planar electroluminescent diodes of gallium arsenide phosphide which emit a radiation of red colour are arranged according to an XY matrix and must each have a light power which is at least equal to 2 millilumen when the corresponding row and column are energized, the current passed through being at least equal to 12 mA and having no noteworthy power when the corresponding row and column are not energized simultaneously; stray currents which are estimated at 0.2 mA may pass through non-energized diodes.

The initial voltage of said diodes of GaAsP is 1.7 volts. The value of the current passed through must be higher than that of the stray currents and is established at minimum 1 mA. The curve of the light power as a function of the current passed through for a diode of the type in question shows that the diode may be considered as extinguished when the current is in the order of 0.1 mA and that it has a light power of 2 millilumen at a current of 10 mA. The current path according to the invention must be traversed by a current of 0.9 mA when the supply voltage is such that 0.1 mA passes through the electroluminescent diode, which corresponds to a voltage which is immediately near the initial voltage. The resistance of the current path thus is 1800 Ohm when the supply voltage is in the order of 1.7 volts. In this case the current path may consist, for example, of a deposited or diffused surface resistance layer which is between 1000 Ohm per square for a surface the ratio of which of the length and the width is 1.8 and 20 Ohm per square for a ratio of 90. An indium oxide layer $In_2O_3$ having a resistivity $= 2.10^{-3}$ Ohm.cm with a surface resistance of 200 Ohm per square and a thickness of 1000 Angstrom is deposited, for example, on a surface having a length of 0.9 mm and a width of 0.1 mm. When the supply voltage is higher than the initial voltage, the admittance of the electroluminescent diode rapidly increases, the current in the current path becomes substantially negligible. At an overall current of 12 mA in which the supply voltage is in the order of 0.8 volts, the current in the current path is 1 mA, that in the diode is 11 mA, and the diode has a light power which is higher than 2 millilumen.

What is claimed is:
1. A monolithic electroluminescent semiconductor device comprising:
   a. a monocrystalline semiconductor body having a major surface;
   b. a semiconductor zone which extends along a part of said major surface of said semiconductor body, said zone adjoining a portion of the semiconductor body and forming therewith a diode that can emit radiation, said diode having a junction which extends to at least said surface of said semiconductor body;
   c. a current path element disposed at said major surface and connected electrically in parallel with said junction, said current path element being physically separate from said semiconductor zone and said semiconductor body portion and leaving said junction at least partly intact at said surface, whereby the current voltage characteristics of said current path and of said diode intersect each other and the dynamic admittance of said current path at the intersection is smaller than that of said diode.

2. A device as in claim 1, wherein said current path consists of a resistor having a resistance value higher than that of the series resistance of said electroluminescent diode, said resistor being electrically connected between said zone and said semiconductor body.

3. A device as in claim 1, wherein said current path comprises a parallel diode having a second junction and which is biased in the same direction as said electroluminescent diode, said second junction showing an internal potential barrier which is lower than the voltage of said electroluminescent diode and the series resistance of said parallel diode being higher than that of said electroluminescent diode.

4. A device as in claim 1, wherein said current path comprises a parallel diode which is biased in the reverse direction of the electroluminescent diode, said parallel diode having an inverse breakdown voltage exceeding the limits of the supply voltage of the device and the dynamic admittance of said parallel diode in the reverse direction being higher than the dynamic admittance of said electroluminescent diode in the forward direction at values of the supply voltage which are lower than the initial voltage of the latter.

5. A device as in claim 3, wherein said current path comprises a diode of the Schottky type which is formed by a semiconductor region which is in contact with a metal element, said contact having rectifying properties.

6. A device as in claim 3, wherein said current path comprises a diode with p-n junction between one of the regions of the electroluminescent diode and a region manufactured from a semiconductor material having a smaller forbidden bandwidth than the material of the said electroluminescent diode.

7. A device as in claim 1, wherein said electroluminescent diode has two regions of opposite conductivity types which are each provided with a non-rectifying element and said current path consists at least partly of a layer of a material having a controlled resistivity which is locallized at the surface of the device, which layer is connected electrically to each of the said regions of said electroluminescent diode.

8. A device as in claim 1, wherein said current path is formed by a deposited surface layer of a material having a low resistivity, said layer being in ohmic contact with the two regions of said electroluminescent diode.

9. A device as claimed in claim 1, wherein said current path consists of a surface layer of low resistivity semiconductor material, said layer having an ohmic contact with one of said two regions of said electroluminescent diode and a contact with the other region of the electroluminescent diode that shows rectifying properties in the same direction as said diode.

10. A device as in claim 1, wherein said current path consists of a surface layer of a semiconductor material having a low resistivity, a first metal element that is in ohmic contact with said layer and with one of the regions of said electroluminescent diode and that is located between said layer and said region, a second metal element which is in ohmic contact with said layer and which comprises a contact having rectifying properties with the second region of said electroluminescent diode, said second metal element being placed between said layer and said second region.

11. A device as in claim 1, wherein said current path consists of a metal surface layer having an ohmic contact with one of said regions of said electroluminescent diode and a rectifying contact, with the other region of said diode, said rectifying contact having a comparatively small area and said ohmic contact having a comparatively larger area.

12. A device as in claim 1, wherein said electroluminescent diode is a diode with planar structure with a first surface region which is locally diffused in a substrate that forms a second region; said current path consisting of a locally diffused surface layer which extends to a small depth in said substrate, said surface layer having the same conductivity type as said first region and a doping concentration considerably higher than that of said first region, said layer contacting the first region along a restricted part of the circumference of the latter.

13. A device as in claim 1, wherein said electroluminescent diode has a planar structure and comprises a substrate and a first surface region locally diffused in said substrate which forms the second region, said current path consisting of a surface layer which is diffused locally in said substrate to a small depth, said surface layer having the same conductivity type as and a doping concentration considerably higher than said substrate, said layer contacting said first region along a restricted part of the circumference of the latter.

14. A device as in claim 1, wherein said current path is a diode formed by the junction between a first surface layer which is diffused locally in a first one of the two regions of said electroluminescent diode and has a conductivity type opposite that of said region, and a second surface layer which is present on said first region and which is ohmically connected to the other region of said electroluminescent diode by connection means.

15. A device as in claim 14, wherein said electroluminescent diode has a planar structure and said zone is diffused locally in a substrate which forms the second region, said current path consisting of a first surface region which is diffused locally in said substrate, and having the same conductivity type as said first region, said surface contacting the said first region, a second surface layer being diffused locally in the said first layer with a conductivity type opposite to that of the latter.

16. A device as claimed in claim 1, comprising a safety diode that comprises a p-n junction in parallel with said diode and said current path, internal potential difference of said safety diode being significantly higher than the voltage which corresponds to the minimum energy of the radiation recombination junctions in said electroluminescent diode, said safety diode having a dynamic admittance which is higher than that of the electroluminescent diode at least for all the values of the supply voltage of the device which are higher than the value which corresponds to the maximum light power which is emitted by the electroluminescent diode during operation.

* * * * *

UNITED STATES PATENT AND TRADEMARK OFFICE
CERTIFICATE OF CORRECTION

PATENT NO. : 4,013,918
DATED : March 22, 1977
INVENTOR(S) : JACQUES LEBAILLY

It is certified that error appears in the above-identified patent and that said Letters Patent are hereby corrected as shown below:

Column 3, line 20, delete "as is provided".

Column 4, line 16, "," should be --.--.

Column 6, line 28, "I = f(v)" should be --I = f(V)--.

Column 7, line 1, delete "at".

Column 8, line 6, "from" should be --form--;

line 67, after "first" insert --region--.

Column 9, line 61, delete ".".

*Signed and Sealed this*

*fifth Day of July 1977*

[SEAL]

Attest:

RUTH C. MASON
*Attesting Officer*

C. MARSHALL DANN
*Commissioner of Patents and Trademarks*